United States Patent [19]

Hartoog et al.

[11] Patent Number: 5,193,092
[45] Date of Patent: Mar. 9, 1993

[54] INTEGRATED PARITY-BASED TESTING FOR INTEGRATED CIRCUITS

[75] Inventors: Mark R. Hartoog, Los Gatos; James A. Rowson, Fremont; Robert D. Shur, Los Altos, all of Calif.; Kenneth D. Van Egmond, Tempe, Ariz.

[73] Assignee: VLSI Technology, Inc., San Jose, Calif.

[21] Appl. No.: 632,281

[22] Filed: Dec. 20, 1990

[51] Int. Cl.[5] .......................................... G01R 31/28
[52] U.S. Cl. ................................. 371/22.4; 371/22.5
[58] Field of Search .................... 371/22.3, 22.4, 22.5, 371/22.6, 49.1, 49.2; 365/201, 185; 324/73 R

[56] References Cited

U.S. PATENT DOCUMENTS 4,749,947 6/1988 Gheewala .......................... 324/73 R

OTHER PUBLICATIONS

Williams, Thomas W. et al., "Design for Testability-A Survey", *IEEE Transactions on Computers*, vol. C-31, No. 1, Jan. 1982, pp. 2-13.

Goldstein, Lawrence H. et al., "SCOAP: Sandia Controllability/Observability Analysis Program" *Sandia National Laboratories*, pp., 190-196.

*Primary Examiner*—Vincent P. Canney
*Attorney, Agent, or Firm*—Clifton L. Anderson

[57] ABSTRACT

An integrated circuit includes parity chains which serve as test logic. Each parity chain has a series of XOR gates, where one input to each succeeding XOR gate in a chain is tied to the output of the preceding XOR gate. The remaining inputs are tied to nodes of the main logic, thus defining test points. An error at any one of the test points is reflected in the output of the parity chain. The outputs of the parity chains are arranged as parallel inputs to a linear feedback shift register which provides a serial signature which can be analyzed to detect integrated circuit defects.

8 Claims, 3 Drawing Sheets

INTEGRATED PARITY-BASED TESTING FOR INTEGRATED CIRCUITS

BACKGROUND OF THE INVENTION

The present invention relates to integrated circuits and, more particularly, to testing of integrated circuits. A major objective of the present invention is to provide integrated circuits with improved integrated testing circuitry.

Much of modern technological progress is identified with miniaturization of integrated circuits. Miniaturization allows for increased functionality by increasing the number of circuits that can be integrated onto a single device. Increased processing speeds are also achieved as the capacitances and distances between circuit elements are reduced. In addition, miniaturization can lower costs by increasing the number of integrated circuit devices that can be made together.

An apparently insatiable market demand for high-density, high-speed integrated circuits encourages manufactures to push semiconductor processing technology to its limits. Not surprisingly, manufacturing yields are usually less than 100%. Effective quality control is required to avoid distribution and use of defective integrated circuits in host systems.

To achieve the most effective quality control, all chips should be thoroughly tested at the latest possible point in the manufacturing process. For less critical components, testing can be limited to samples from batches. Testing should be applied as late as possible in the integrated circuit processing. Preferably, testing is performed after integrated circuits are mounted in the packaging that provides the protection and host system interfacing for the integrated circuit. "In package" testing can identify integrated circuits that are defective either due to steps in wafer manufacture or due to steps in the packaging process. However, testing integrated circuits while they are still on a wafer can provide significant cost savings, avoiding waste involved in packaging defective dice. Hence, a combination of both pre- and post-packaging testing is often optimal.

Simple circuits can be exhaustively tested by examining the outputs resulting from all possible input combinations. This form of testing conveniently relies only on the input and output pads to be used in communicating with a host system. No circuitry or chip area is dedicated to testing alone. For combinationsl circuits, in which the outputs are a function only of the current inputs, the number ($2^n$) of potential test vectors increases exponentially with the number of physical inputs (n). The number of test vectors can be much greater for non-combinatorial circuits, for which the outputs depend not only on the inputs but also on the previous state of the integrated circuit. The time required to apply all possible test vectors to a densely integrated circuit exceeds practical limits.

Since exhaustive testing is impracticable, a subset of all possible test vectors can be applied to the inputs. Various software programs have been developed to aid in the selection of test vectors to optimize the chances that a defect, if one exists, will be detected using the test vector subset. However, in most cases, the main inputs and outputs do not provide sufficient control and observability to ensure that the operation of all internal circuits can be tested. In this context, "control" is the ability to force a selected test point to a chosen value, and "observability" is the ability to identify the value of a selected test point. Furthermore, while fewer test vectors are required than in the exhaustive approach, the number of test vectors still scales dramatically with chip density.

Dedicated interfacing must be provided for access to internal test points. Most testing approaches generate multiple channels of data in response to test vector inputs. It is not practical to provide separate outputs for each test output channel. Accordingly, it is common practice to tie output channels to respective parallel inputs of a parallel-in, serial-out, shift register. In effect, the separate test channels can be time-multiplexed so that only a single output pad and/or pin is required to read test results. If a simple shift register were used, it would have to be "clocked out" for each test vector. To save time, linear-feedback shift registers (LFSRs) can be used in conjunction signature analysis to detect errors in the logic being tested. When an LFSR is used, the shift register need be clocked only once per test vector.

It is not realistic to provide an output shift register with a parallel input for each test point. Hence, modern on-chip test architectures use various approaches to couple multiple test points to each parallel shift register input.

In a "scan-test" approach, existing storage elements, such as flip-flops, can be chained together during testing to form shift-registers which can be read out serially for test purposes. The use of existing storage elements minimizes the "real-estate" overhead of this testing scheme. The scan-test approach, in effect, allows each parallel input of the output shift register to be used on a time-multiplexed basis.

One disadvantage of the scan-test approach is that the rate at which vectors can be introduced is limited by the need to clock out each chain of storage elements into the output shift register. In addition, it is costly to apply this approach in circuits which do not have a sufficient number of storage elements in the right locations for test purposes. Test-dedicated storage elements can be added to the main logic, but only at the cost of the significant area consumed by memory elements.

A grid-based, cross-check approach does not rely on existing memory elements, and thus can provide greater testing flexibility. The cross-check approach adds a grid to the main logic for addressing test points. The grid comprises horizontal and vertical conductors. Each test point is coupled via a transistor to a horizontal conductor which serves as an input to a respective parallel input of the output shift register. The status of each of the coupling transistors is controlled by one of the vertical conductors. The test points are addressed column by column by activating one vertical conductor at a time. The vertical conductors are coupled to the parallel outputs of a serial-in, parallel-out shift register. This shift register is typically filled with a single "1", the rest of its memory stages being filled with "0s". Successive columns are addressed as the "1" is clocked through this parallel out shift register.

The cross-check approach does incur a "real-estate" penalty in that space for routing horizontal and vertical conductors must be provided. In addition, an extra transistor is added per test point. However, the time penalty of the cross-check approach is more severe than the real-estate penalty.

The grid-based cross-check approach shares with the scan-test approach the limitation that the results of each vector are time-multiplexed into the output shift register. The need to clock test vector results into the output shift register lengthens the time required for a test-cycle to be completed.

What is needed is an improved testing facility for complex integrated circuits. In particular, the time required for testing a device should be reduced. In addition, a more advantageous trade-off between circuit area and testability is required. The provision for testing should minimally impact device performance once the pre-tested integrated circuit is installed in a host system.

SUMMARY OF THE INVENTION

In accordance with the present invention, integrated circuit logic includes, in addition to main functional logic, testing logic in the form of one or more parity strings. Each parity string consists of a series of parity elements, such as XOR or XNOR gates. Each parity element but the first in a string has one input coupled to the output of the preceding parity element. The remaining parity-chain inputs, including the inputs to the first parity element, are tied to main logic nodes. The output of the last parity element, which is the output of the parity string, is directly or indirectly accessible to an external testing system which can analyze the output to detect a defect in the integrated circuit.

Each parity chain can be fabricated on the same substrate as the main logic. Interface to the parity chains is preferably primarily through the interfacing required for the main logic. However, additional interfacing dedicated to the testing function can be incorporated. For example, test logic can share an output with the main logic through a multiplexer which is controlled by a dedicated "test enable" input. When a parity error is represented by the output of a parity chain, an indication of this parity error can be provided, either directly, by transmitting the indication directly to the test system, or indirectly, wherein some signature or other analysis is performed on-chip.

Multiple parity chains can be utilized to minimize the likelihood that coincidental errors will mask each other. To minimize interfacing required for test logic, several parity chains can feed respective inputs of a parallel input shift register. The contents of the shift register can be read out serially, so that only one output is required for multiple parity chains. The shift register can be read out every clock cycle. Alternatively, a signature analysis shift register, using feedback, can be used to allow several parity chain outputs to be accumulated between readouts.

To limit the chip area required by the parity strings, the number of parity element inputs across all parity test chains can be limited to about 30% of all main circuitry nodes, a node being an input or output of any device, e.g., transistor or resistor, of the main logic. Optimal selection can involve a testability analysis, which can be computer based. The testability analysis can be performed iteratively to aid in convergence to a near optimal solution. The analysis indicates which points would be difficult to test without further access. These points can be tied to inputs of the parity elements. Further analysis can indicate how the parity elements can be chained together to minimize the masking of error detections.

The interface requirements for the present invention are minimal. Test outputs can be communicated through multiplexed main logic outputs. A single test mode input can provide the switching for the multiplexing. Even this test mode input can be performed using an otherwise unused combination and/or sequence of host system inputs to trigger the test mode selection. Thus, the I/O interface requirements of the present invention are minimal.

The chip area requirements of the present invention are also quite reasonable. Since the test nodes collectively need constitute only a fraction of the total number of main logic nodes, the total area requirements can be maintained within any specified limitation. Prioritization techniques ensure that the parity elements can be arranged to test the most critical nodes. Individual parity elements, e.g., XOR gates, consume very little area. For example, an XOR gate consumes much less area than a memory element such as a flip-flop, as used in the scan-test approaches described above.

Furthermore, the present invention provides for faster and more economical testing. The output of a parity chain represents a nearly instantaneous indication of defects at the nodes addressed by the parity elements of the chain. In the scan-test approach, the information has to be clocked out serially from a flip-flop chain. In the grid-based cross-check approach, serial addressing is required to complete a single scan. Of course, all these approaches are subject to the time limitation of any shift-registers used to pipeline data out a single output to save on interface requirements.

The stray capacitance that could otherwise limit the high-frequency performance of an integrated circuit is kept minimal by the present invention. Parity elements can be located near nodes to be tested, minimizing the use of long leads that could otherwise contribute to stray capacitance. The small size of the XOR gates provides capacitance advantages over the flip-flops used in the scan test approach. Furthermore, since the XOR gates are not part of the main logic and since the output of a parity chain does not need to be clocked out, the parity elements need not be dimensioned for high speed operation. Accordingly, they can be made quite small, minimizing any contribution to parasitic capacitance and maximizing the area available for main logic functions.

Another advantage of the present invention is the limited amount of data that needs to be analyzed to detect defects. The grid-based cross-check approach requires processing of a much larger percentage of nodes. The scan test approaches also process each node separately. As with the present invention, on-chip signature analysis can be performed on chip. The present invention compresses defect data even before any signature analysis is done.

Thus, the present invention provides for customized integrated test circuitry that can be use both before and after packaging. Relatively little chip area and relatively little additional interfacing complexity is required to add the testing circuit. The modest interfacing requirements permit effective testing both before and after packaging. The small size of the parity elements further limits any adverse effect on main logic performance. Defect information is rapidly acquired and presented in a concise format. These and other features and advantages of the present invention are apparent from the description below with reference to the following drawings.

DESCRIPTION OF THE PREFERRED EMBODIMENT

Figure 1:
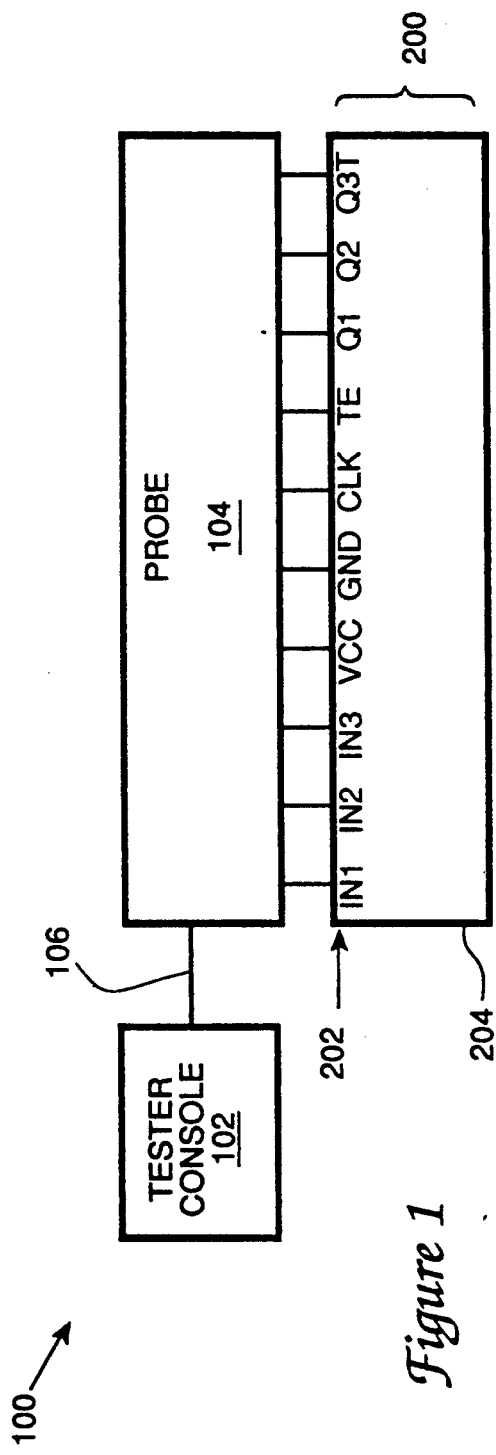
FIG. 1 is a block diagram of an integrated circuit in accordance with the present invention interfaced with a testing system.

An integrated circuit 200 in accordance with the present invention is shown being tested using a test system 100 in FIG. 1. Test system 100 includes a test console 102 and a test probe 104 as well as interconnecting cable 106. Test console 102 transmits test vectors to probe 104 an analyzes results received from integrated circuit 200; test console 102 also provides a user interface to the test program and results. Probe 104 includes several conductive contacts which mate with interface contacts of integrated circuit 200. These contacts include three inputs IN1, IN2, and IN3, power VCC, ground GND, clock CLK, test enable TE, and outputs Q1, Q2 and Q3T, the last of which serves as a test output as well as an output to a host system in which integrated circuit 200 is to be incorporated.

Probe 104 contacts wire-bond pads on integrated circuit 200 to test before packaging. An electrical equivalent but mechanically different probe is used after packaging. The post-packaging probe contacts package pins rather than wire bond pads fabricated on integrated circuit 200 itself.

Figure 2:
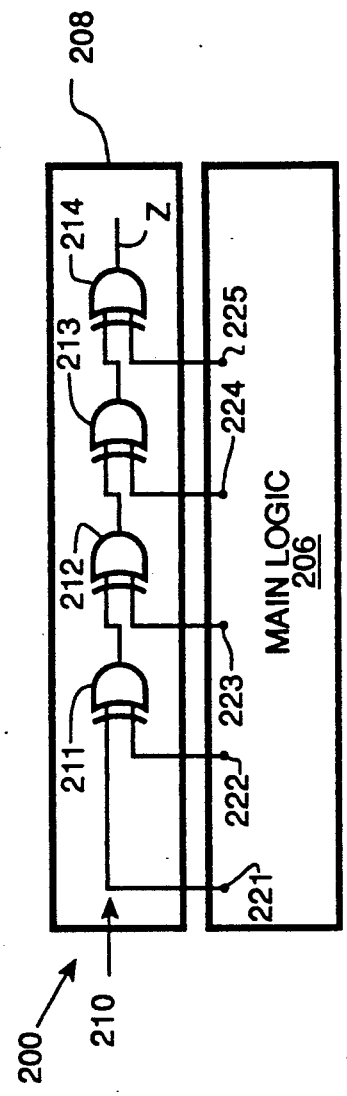
FIG. 2 is a schematic illustration the integrated circuit of FIG. 1.

Integrated circuit 200 includes logic 202 built on a substrate 204, as shown in FIG. 1. Logic 202 includes main logic 206 and test logic 208, as shown in FIG. 2. Main logic 206 defines the function that integrated circuit 200 is to perform once incorporated in a host system. Test logic 208 includes several parity chains, including parity chain 210 which is used during testing, but is essentially invisible to a host system. Parity chain 210 includes four XOR gates 211, 212, 213 and 214, which serve as parity elements of parity chain 210. An XOR gate serves as a parity element in that a binary value change at exactly one of its inputs is reflected in a change in the gates output.

First XOR gate 211 has both of its inputs tied to main logic nodes, which thus serve as test points 221 and 222 by virtue of their coupling to parity chain 210. Further main logic nodes serve as test points 223, 224 and 225 by virtue of their couplings to inputs of XOR gates 212, 213 and 214, respectively. Each of these last three XOR gates 212, 213 and 214 has its other input tied to the output of the preceding XOR gate 211, 212 and 213, respectively. The output of the last XOR gate 214 is the binary output of parity chain 210.

During testing, test console 102 generates inputs to integrated circuit 200. Given the particular inputs generated, the values expected at test points 221-225 are predetermined. These values would force the value at the parity chain output to a predetermined binary value, i.e, either logic high or logic low. If exactly one test point reaches the wrong value, this error is reflected in the output Z which attains the value opposite to the expected value. Thus, the output Z can be used to detect a defect. Test points 221-225 are selected to minimize the likelihood that a defect will be masked by an even number of errors. This selection procedure is discussed further below.

Figure 3:
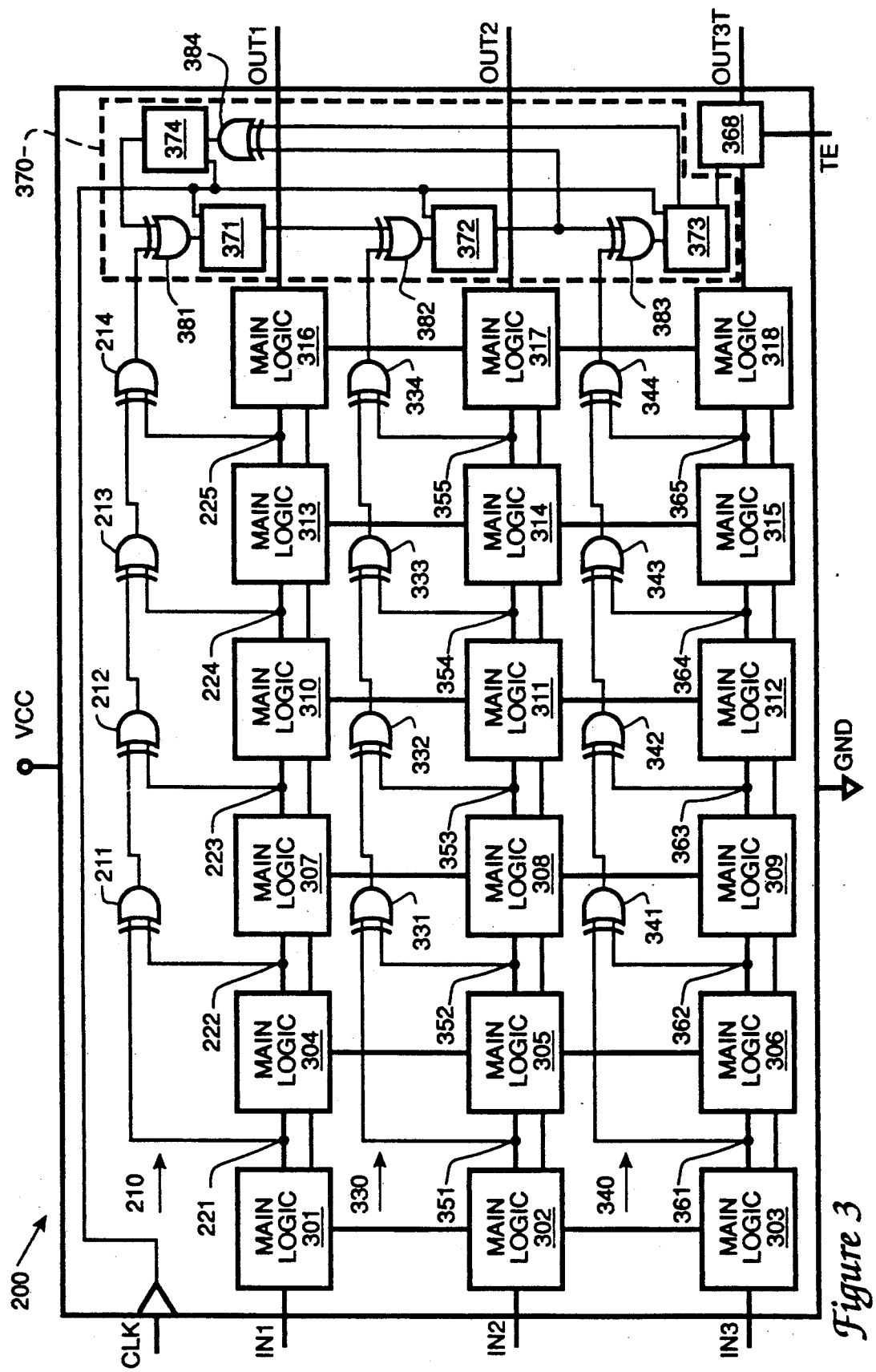
FIG. 3 is another schematic illustration the integrated circuit of FIG. 1.
Figure 4:
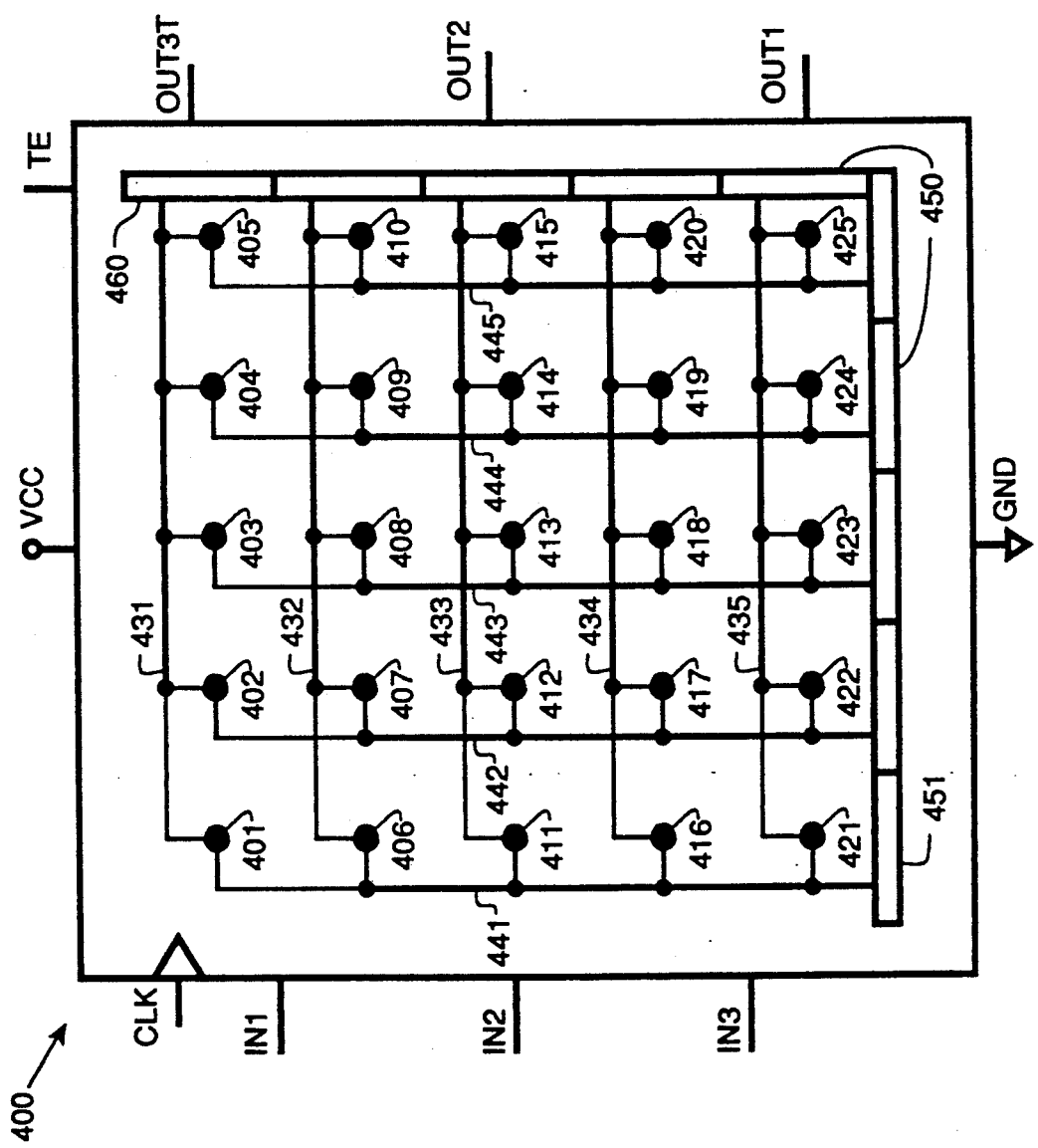
FIG. 4 shows another perity chain.

Integrated circuit 200 is shown in greater schematic detail in FIG. 3. Main logic 206 is shown divided into eighteen main logic sections 301-318. In addition to parity chain 210, parity chains 330 and 340 are illustrated. Each of parity chains 210, 330, 340 tests a respective set of main logic nodes. Parity chain 330 addresses test points 351-355 which are coupled to inputs of XOR gates 331-334, and parity chain 340 addresses test points 361-365 which are coupled to inputs of XOR gates 341-345.

Multiply parity chains are used to minimize the likelihood that errors will be masked and to facilitate routing of the test logic. So that the test logic 208 does not require multiple outputs, parity chains 210, 330 and 340 serve as parallel inputs to a shift register 370, which can be read serially through a single output OUT3T. This single test output is shared by main logic 206 so that all outputs are available to the host system. The test and host modes of output OUT3T are governed by a multiplexer 368 that selects between the output of shift register 370 and the output of main logic unit 318 in response to a select input at the test enable input TE. This input is required to be low when incorporated into a host system. Test system 100 forces this input high to implement testing.

Shift register 370 includes an XOR gate and a latch for each parity chain to implement parallel input. Specifically, the outputs of parity chains 210, 330, and 340, are respectively directed to latches 371, 372 and 373 via respective XOR gates 381, 382 and 383. XOR gates 381, 382 and 383 permit combination of incoming parity indications with information recycling through shift register 370. The output of latch 373 is the output of shift register 370.

In addition, shift register 370 includes another latch 374 and corresponding XOR gate 384. This latch-gate pair combines feedback from latches 372 and 373, with the result being directed to XOR gate 381. The data fed back to XOR gate 381 is XORed with the output of parity chain 210 to provide the input to latch 371. XOR gate 382 combines the output of latch 371 with the output of parity chain 330 to determine the input of latch 372. XOR gate 383 combines the output of latch 372 with the output of parity chain 340 to determine the input of latch 373. Latches 371-374 are governed by a clock signal derived from the CLK input of integrated circuit 200.

Except after shift register 370 is reset, incoming parity error indications are combined with information recycling through the shift register. Necessarily, this combination results in a loss of information. In other words, some parity error indications can be obscured. The functions imposed by XOR gates 381-384 are selected to minimize the likelihood of masking parity error indications.

Test points 221-225, 351-355 and 361-365 are selected from the main logic nodes of main logic 206. Priority is given to nodes which would be the most unobservable in the absence of a connection to a parity chain. A measure of observability can be provided by a software analysis of the integrated circuit design. Such analysis can be provided by a program called "SCOAP" for "Sandia Controllability/Observability Analysis Program" developed at Sandia National Laboratories by Lawrence H. Goldstein.

Test points are selected iteratively, since the selection of a node as a test point affects the observability of the remaining nodes. Thus, a SCOAP analysis can be run, and the least observable node can be selected as the first test point. Then, the SCOAP analysis is rerun on the original circuit as modified by the new access to the selected node. The test point selection process can continue until all nodes have an acceptable level of observability. Generally, the number of test points should be a third or less of the total number of main logic nodes. In many cases, fewer than 10% of the main logic nodes need be test points. In alternative embodiments, the total number n of test points can be predetermined and the SCOAP analysis can be used to select the n least observable nodes for connection to parity chains.

The minimum number of parity chains is determined by the necessity of avoiding masking of defects. For example, a single parity chain should not be coupled to both the input and output of an inverter. If such connections were made, an error at one test point would probably result in an error in the other test point. Two parity errors cancel, so that both errors would be undetected. This problem is most clear with simple logic elements like inverters, but applies to more complex gates and cells as well. The answer is to place closely related test points in different parity chains so that error masking is minimized.

Of course, routing considerations affect the number of parity chains and the allocation of test points to parity chains. In some cases, routing considerations can affect which nodes are selected as test points.

A second integrated circuit 400 embodying the present invention includes twenty-five test points 401-425. These test points are coupled to ten parity chains, five horizontal 431-435 and five vertical 441-445. Each test point is coupled to two parity chains, one horizontal and one vertical. For example, test point 401 is coupled to horizontal parity chain 431 and vertical parity chain 441. The purpose of this dual coupling is to minimize masking errors.

The outputs of parity chains 431-435 and 441-445 are input to an L-shaped linear feedback shift register 450. Shift register 450 includes ten stages, including a first stage 451 and last stage 460. Shift register 450 provides for feedback from last stage 460 to first stage 451. Each stage provides for combination of parity indications arriving from parity chains 431-435 and 441-445 with information cycling through shift register 450. During test mode, last stage 460 is coupled to output OUT3T. A signature analysis can be performed on the test output from output OUT3T.

In general, the present invention provides for various mappings of main logic nodes to parity element inputs. In an exhaustive implementation, all main logic nodes are coupled to parity element inputs. Alternatively, a small percentage of main logic nodes are so coupled to serve as test points. In some embodiments, all test points are tied to a single parity element input. In other embodiments, all test points are tied to elements of two distinct parity chains. Alternatively, some test points can be tied to one chain, while others are tied to two or even three parity element chains. For example, only those test points determined to be especially subject to masking can be coupled to two or more parity chains.

The present invention provides for various parity chain geometries. In integrated circuit 200, all parity chains are parallel. Circuit 400 includes vertical and horizontal parity chains. Other circuits can include parity chains which change and even reverse directions. Parity chains can "snake" around as required to reach selected test points. Some parity chains can terminated at an intermediate parity element of another parity chain.

The present invention provides for integrated circuits with one or more parity chains. Parity chains can be coupled to host system outputs or to dedicated test outputs. The dedicated test outputs can be designed to be accessible after packaging, although some embodiments employ dedicated test outputs that are accessible only before packaging. Parity elements can be XOR gates, XNOR gates, or both. In addition, other types of parity elements can be used, including those with three or more inputs.

Power and ground are considered main logic nodes so that some parity elements can have one or more inputs tied to a fixed signal. This has the effect of passing through the signal (or its inverse) from the previous parity element, so that the parity element with one fixed input is basically non-operative. However, this arrangement can be expedient in custom circuits where the building blocks of the test logic must be defined before the main logic is defined.

The present invention provides for dedicated test circuitry to be combined monolithically with main logic. Thus, during normal operation, the incorporating integrated circuit provides outputs as a function of its inputs. This function can be a first order function, in which case the outputs are determined by the present inputs and the circuit is combinatorial. A read only memory is such a combinatorial circuit. Alternatively, the function can be of second or greater order, in which case, the output is a function of the present inputs plus previous inputs. Various state machines are implemented in this vain. Furthermore, the present invention provides for circuits in which the outputs are not entirely determined by the present and past inputs. For example, various stochastic functions are provided for.

While it is possible for each parity chain to have its own output, generally, multiplexing is desired to minimize the interfacing requirements for the integrated circuit. Shift registers with and without feedback can be used. Both linear and non-linear feedback shift registers can be used for signature analysis. As an alternative, the outputs of parity chains can be multiplexed in other ways. Alternatively, parity chain outputs can be combined, for example, as branches of a "mother" parity chain. This approach is necessarily constrained by the need to avoid error masking. However, this parity tree approach could be used to the extent permitted by error masking constraints to permit a smaller shift register and faster test throughput. These and other modifications to and variations upon the preferred embodiments are provided for by the present invention, the scope of which is limited only by the following claims.

What is claimed is:

1. An integrated circuit comprising:
   a substrate;
   logic fabricated on said substrate, said logic including main logic and test logic,
   said main logic including multiple integrated circuit elements arranged to provide main outputs as a function of main inputs, said main logic including multiple test nodes coupled to respective ones of said integrated circuit elements, said test nodes including power and ground power sources;

said test logic including at least a first parity chain, said first parity chain having plural parity elements including a first parity element and a last parity element, each of said parity elements having an output and at least two inputs, each of said parity elements providing an output signal which changes whenever exactly one input signal changes, each of said parity elements but the first one having at least one input coupled to a respective one of said test nodes and another input coupled to the output of the preceding parity element of said parity chain, said first parity element having at least two inputs coupled to said test nodes, the output of said last parity element being the output of said first parity chain; and interface means attached to said substrate for communicating with a host system when said integrated circuit is incorporated in said host system and communicating with a test system when said integrated circuit is being tested, said interface means providing for inputs of test vectors from said test system, said interface means including test output means for providing the results of said test vectors to said test system.

2. An integrated circuit as recited in claim 1 wherein said test logic includes additional parity chains characterized as said first parity chain, said interface means including a shift register with parallel inputs, each of said parity chains having its output coupled to a respective one of said parallel inputs, said shift register having a serial output, said interface means providing for coupling of said serial output with said test system.

3. An integrated circuit as recited in claim 2 wherein one of said test points is coupled to an input of one of said parity elements of said first parity chain and, additionally, coupled to an input of another parity element which is included in one of said additional parity chains.

4. An integrated circuit as recited in claim 2 wherein said shift register is a feedback shift register which provides a test signature to said test system.

5. An integrated circuit as recited in claim 1 wherein said interface means includes a mode input for mode selection, said mode input providing selection of a test mode in which test vectors are accepted from said test system and the results of said test vectors are transmitted to said test system, said mode input providing in the alternative for a host mode in which said main logic is coupled to said host system and said test logic is not coupled to said host system.

6. An integrated circuit for use in a host system, said integrated circuit providing for testing using an external integrated circuit tester including a test probe, said integrated circuit comprising:

host interface means for communicating with said host system;

main logic for providing output signals to said host system via said host interface as a function of input signals received from said host system via said host interface, said main logic including plural logic nodes to be evaluated during testing;

probe interface means for interfacing with said test probe, said probe interface means including probe inputs and sense outputs, said probe inputs and said plural logic nodes collectively constituting plural test points;

at least one parity chain of parity elements, said chain having a first parity check element, a last parity check element, and plural intermediate parity elements, each of said parity elements having at least two inputs and one output, each parity check element being designed so that the value at its output changes whenever the value of exactly one of its inputs changes, each of said parity elements but the first one having one input coupled to the output of the preceding parity element of said parity chain and another input coupled to one of said test points, said first parity element having at least two inputs coupled to said test points, the output of said last parity element being the output of said parity chain; and parity communication means for communicating the output of said parity chain to said tester;

whereby said tester can detect faults in said main logic by comparing the actual value output of said parity chain with an expected output value.

7. An integrated circuit as recited in claim 5 wherein said integrated circuit further comprises additional parity chain of parity elements and wherein said parity communication means provides for communication of the outputs of each of said parity chains to said tester.

8. An integrated circuit as recited in claim 6 wherein said parity communication means includes a linear feedback shift register, said shift register having inputs coupled to outputs of said parity chains.

* * * * *